(12) United States Patent
Zhang et al.

(10) Patent No.: US 12,176,226 B2
(45) Date of Patent: Dec. 24, 2024

(54) SYSTEM, METHOD AND DEVICE FOR TEMPERATURE CONTROL

(71) Applicant: CHANGXIN MEMORY TECHNOLOGIES, INC., Hefei (CN)

(72) Inventors: Guoqing Zhang, Hefei (CN); Su Yang, Hefei (CN); Duocai Sun, Hefei (CN); Xingfeng Hong, Hefei (CN); Yiqun Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 388 days.

(21) Appl. No.: 17/647,738

(22) Filed: Jan. 12, 2022

(65) Prior Publication Data
US 2023/0029782 A1 Feb. 2, 2023

Related U.S. Application Data

(63) Continuation of application No. PCT/CN2021/112826, filed on Aug. 16, 2021.

(30) Foreign Application Priority Data

Jul. 30, 2021 (CN) .......................... 202110871667.9

(51) Int. Cl.
H01L 23/34 (2006.01)
G05D 7/06 (2006.01)
G05D 23/19 (2006.01)
H01L 21/67 (2006.01)
F27B 17/00 (2006.01)
F27D 19/00 (2006.01)

(52) U.S. Cl.
CPC ..... *H01L 21/67248* (2013.01); *G05D 7/0623* (2013.01); *G05D 23/1917* (2013.01); *F27B 17/0025* (2013.01); *F27D 2019/0018* (2013.01); *F27D 2019/0031* (2013.01)

(58) Field of Classification Search
CPC ....... H01L 23/34; H01L 23/46; H01L 23/467; H01L 21/67248
See application file for complete search history.

(56) References Cited

U.S. PATENT DOCUMENTS

| | | | |
|---|---|---|---|
| 7,601,933 B2 * | 10/2009 | Yoshihara | ............... F27D 19/00 118/724 |
| 10,147,655 B2 * | 12/2018 | deVilliers | ......... H01J 37/32715 |
| 10,256,123 B2 | 4/2019 | Mahadeswaraswamy | |
| 2004/0144488 A1 | 7/2004 | Shoya | |

(Continued)

FOREIGN PATENT DOCUMENTS

| | | | | |
|---|---|---|---|---|
| CN | 202331010 U | | 7/2012 | |
| CN | 105892243 A | * | 8/2016 | ............... G03F 7/40 |
| CN | 110875208 A | | 3/2020 | |

(Continued)

*Primary Examiner* — Gregory A Wilson
(74) *Attorney, Agent, or Firm* — Syncoda LLC; Feng Ma

(57) ABSTRACT

A method for temperature control includes: acquiring the present temperature of a reaction window in a process chamber of a semiconductor machine; comparing the present temperature with the preset temperature to acquire a comparison result; and adjusting the exhaust amount of an exhaust passage of the process chamber based on the comparison result to control the temperature of the reaction window.

13 Claims, 4 Drawing Sheets

(56) References Cited

U.S. PATENT DOCUMENTS

2006/0225769 A1\* 10/2006 Goshi ............... H01L 21/67248
                                                         134/108
2020/0216961 A1\* 7/2020 Nomura ................ C23C 16/507

FOREIGN PATENT DOCUMENTS

| CN | 111063623 | A |   | 4/2020  |        |              |
|----|-----------|---|---|---------|--------|--------------|
| CN | 110875208 | B | \* | 11/2022 | ....... | H01L 21/67248 |
| JP | 2020064939 | A | \* | 4/2020  | ........... | H01L 21/324 |
| KR | 101752829 | B1 | \* | 6/2017  |        |              |

\* cited by examiner

SYSTEM, METHOD AND DEVICE FOR TEMPERATURE CONTROL

CROSS-REFERENCE TO RELATED APPLICATIONS

The present application is a continuation of International Patent Application No. PCT/CN2021/112826 filed on Aug. 16, 2021, which claims priority to Chinese Patent Application No. 202110871667.9 filed on Jul. 30, 2021. The disclosures of the above-referenced applications are incorporated herein by reference in their entirety.

BACKGROUND

With the rapid development of a semiconductor technology, the characteristic size of an integrated circuit device is shrinking continuously. In order to manufacture a high-quality integrated circuit device, the requirements for the manufacturing process and process results of an integrated circuit are more and more stringent, because the processing result of each process may affect the characteristic, quality and service life of the integrated circuit device.

In the field of semiconductors, a wafer is a basic material for manufacturing the integrated circuit. It may be processed into various circuit component structures on the wafer. Usually, the wafer is transferred to a process cavity. The air pressure and the temperature in the process cavity have a great impact on the wafer production. If the temperature is too high or too low, generated by-products will fall onto the wafer, thereby affecting the quality of the wafer and reducing the yield of the wafer.

SUMMARY

The disclosure relates, but is not limited, to a system, method and device for temperature control.

The technical solution of the embodiment of the disclosure is realized below.

The embodiment of the disclosure provides a method for temperature control, which includes the following operations.

The present temperature of a reaction window in a process chamber of a semiconductor machine is acquired.

The present temperature is compared with the preset temperature to acquire a comparison result.

Based on the comparison result, the exhaust amount of an exhaust passage of the process chamber is adjusted to control the temperature of the reaction window.

The embodiment of the disclosure provides a device for temperature control, which is applied to a semiconductor machine and includes an acquisition circuit, a temperature comparison circuit and an adjustment circuit.

The acquisition circuit is configured to acquire the present temperature of a reaction window in a process chamber of the semiconductor machine.

The temperature comparison circuit is configured to compare the present temperature with the preset temperature to acquire a comparison result.

The adjustment circuit is configured to adjust the exhaust amount of an exhaust passage of the process chamber based on the comparison result to control the temperature of the reaction window.

The embodiment of the disclosure provides a system for temperature control, which is applied to a semiconductor machine and includes a temperature sensing assembly, a control assembly and an exhaust adjusting assembly.

The temperature sensing assembly is arranged on a reaction window of a process chamber of the semiconductor machine, and is configured to sense a temperature of the reaction window.

The control assembly is connected with the temperature sensing assembly, and configured to: acquire the present temperature of the reaction window from the temperature sensing assembly; compare the present temperature with the preset temperature to acquire a comparison result; and control the exhaust adjusting assembly to adjust the exhaust amount of an exhaust passage of the process chamber based on the comparison result to control the temperature of the reaction window.

The exhaust adjusting assembly is arranged on the exhaust passage of the process chamber, connected with the control assembly, and configured to control the exhaust amount of the exhaust passage.

DETAILED DESCRIPTION

In order to make the purposes, technical solutions and advantages of the disclosure clearer, the technical solutions of the disclosure will be further described in detail below with reference to the drawings and embodiments. The embodiments described herein should not be regarded as a limitation of the disclosure. All other embodiments acquired by those of ordinary skilled in the art without creative work shall fall within the scope of protection of the disclosure.

In the following description, reference is made to "some embodiments", which describe a subset of all possible embodiments, but it is understood that "some embodiments" may be the same or different subsets of all possible embodiments and may be combined with each other without conflict.

If a similar description of "first/second" appears in the disclosure document, the following description is added. In the following description, the term "first\second\third" is only to distinguish similar objects and does not represent a specific order for objects. It is understandable that "first\second\third" can exchange a specific order or order if allowed, so that the embodiments of the disclosure described herein can be implemented in an order other than those illustrated or described herein.

Unless otherwise defined, all technical and scientific terms used herein have the same meanings as commonly understood by those skilled in the art that the disclosure belongs to. Herein, terms used in the disclosure are only for the purpose of describing embodiments of the disclosure and not intended to limit the disclosure.

In order to better understand the method for temperature control provided in the embodiment of the disclosure, the problems existing in a process chamber of a semiconductor machine in a related art are described below.

In the process of implementing the disclosure, the inventor finds that there are the following problems in the process chamber of the semiconductor machine in the related art: on the one hand, an exhaust system of a machine does not have a temperature feedback system and does not apply an automatic opening degree control technology, it is pure natural full open exhaust, and the exhaust amount will not be adjusted with the temperature change of a reaction window to control the temperature; on the other hand, when an alarm occurs in the machine, exhaust of a heater of the reaction window is still fully open, the temperature will decrease rapidly, and the engineer has no time to deal with it; and in addition, in the wafer production process, the temperature in the reaction chamber may not be stabilized only by controlling the output power of the heater in the reaction window.

Figure 1:
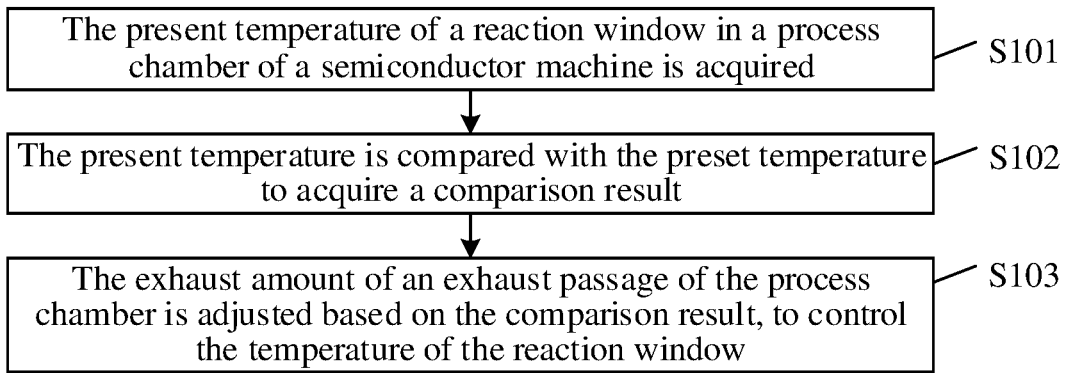
FIG. 1 is an implementation schematic flowchart of a method for temperature control provided in an embodiment of the disclosure.

The embodiment of the disclosure provides a method for temperature control, as illustrated in FIG. 1, which includes the following operations.

At S101, the present temperature of a reaction window in a process chamber of a semiconductor machine is acquired.

Herein, the process chamber may be configured to perform wafer process treatment. The treatment process may be plasma etching on a wafer. The reaction window may be located above a plasma generator such as transformer coupled plasma, and the temperature in the process chamber may be controlled by heating the reaction window. The treatment process may also be sputtering and depositing metal on the wafer with photoresist, the reaction window may be located above a sputtering source, and the temperature in the process chamber when sputtering metal may be controlled by heating the reaction window. It may also be other treatment processes requiring temperature control.

During implementation, the present temperature of the reaction window may be acquired by setting a temperature sensor in the reaction window, or the present temperature of the reaction window may be acquired by setting a temperature inductor in the reaction window.

At S102, the present temperature is compared with the preset temperature to acquire a comparison result.

Herein, the preset temperature may at least include a temperature value, which may be a specific temperature value or a temperature range. Within the temperature range, a machine may work normally, the generation amount of by-products is small, and the possibility of wafer damage is also relatively low. For example, the preset temperature may be the corresponding temperature value or temperature range when the machine may work normally and the yield of the produced wafer is the highest. For example, at 118° C., the yield of the produced wafer is 99.1%; at 120° C., the yield of the produced wafer is 99.9%, and at 125° C., the yield of the produced wafer is 99%. Then, the preset temperature may be 120° C.

At S103, based on the comparison result, the exhaust amount of an exhaust passage of the process chamber is adjusted to control the temperature of the reaction window.

Herein, the gas flow cross-sectional area of the exhaust passage may be adjusted to adjust the exhaust amount of the exhaust passage of the process chamber. For example, when the present temperature is higher than the preset temperature, the gas flow cross-sectional area may be increased to reduce the temperature. When the present temperature is lower than the preset temperature, the gas flow cross-sectional area may be reduced to increase the temperature. The gas flow rate of the exhaust passage may also be adjusted to adjust the exhaust amount of the exhaust passage of the process chamber. For example, when the present temperature is higher than the preset temperature, the gas flow rate may be increased to reduce the temperature; and when the present temperature is lower than the preset temperature, the gas flow rate may be reduced to increase the temperature. The gas flow cross-sectional area and the gas flow rate of the exhaust passage may also be adjusted at the same time to adjust the exhaust amount of the exhaust passage of the process chamber.

During implementation, the rate of temperature reduction may be increased or reduced by adjusting the exhaust amount of the exhaust passage of the process chamber, so that the reduction or increase of temperature may be indirectly controlled. A heating assembly is set in the reaction window, and the temperature of the reaction window may be controlled by adjusting the output power of the heating assembly. The output power of the heating assembly and the exhaust amount of the exhaust passage of the process chamber are adjusted at the same time, so that the two cooperate with each other to control the reaction window, and thus, the temperature of the reaction window may be rapidly stabilized. For example, when the present temperature is less than the preset temperature, the heating assembly may be turned on to make the output power of the heating assembly reach the rated power and reduce the exhaust amount. When the present temperature is close to the preset temperature, for example, the difference between the present temperature and the preset temperature is 5° C., the output power of the heating assembly may be slowly reduced to make the present temperature equal to the preset temperature. For example, when the present temperature is greater than the preset temperature, the heating assembly may be directly turned off, and the exhaust amount is increased, so that the present temperature is equal to the preset temperature finally.

In the embodiment, the exhaust amount of the exhaust passage of the process chamber may be adjusted according to the temperature change of the reaction window, so that the temperature stability of the reaction window may be effectively controlled.

In some embodiments, the method may also include: the working state of the heating assembly of the reaction window in the semiconductor machine is acquired. Correspondingly, operation S101 may include: a present temperature of the reaction window in the process chamber of the semiconductor machine is acquired when the working state of the heating assembly is turned on.

Herein, the heating assembly may be an infrared heater, a resistance heater or an electromagnetic heater, etc. The working state of the heating assembly may be turned on or turned off. During implementation, the working state of the heating assembly may be determined by detecting the output power of the heating assembly. For example, when the output power is zero, it may be determined that the working state of the heating assembly is turned off; and when the output power is greater than zero, it may be determined that the working state of the heating assembly is turned on. The working state of the heating assembly may also be determined by detecting whether there is current in the heating assembly. For example, when there is current in the heating assembly, it may be determined that the working state of the heating assembly is turned on, and when there is no current in the heating assembly, it may be determined that the working state of the heating assembly is turned off.

Figure 2:
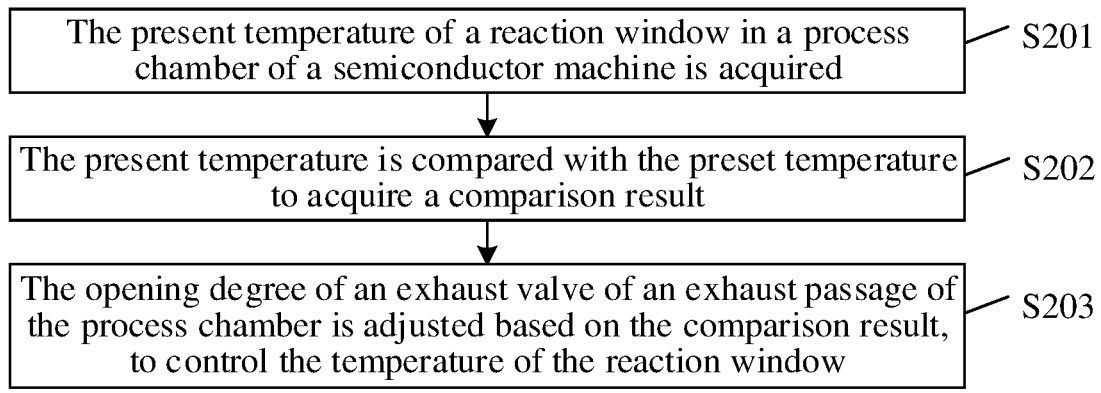
FIG. 2 is an implementation schematic flowchart of a method for temperature control provided in an embodiment of the disclosure.

The embodiment of the disclosure provides a method for temperature control, as illustrated in FIG. 2, which may include the following operations.

At S201, the present temperature of a reaction window in a process chamber of a semiconductor machine is acquired.

At S202, the present temperature is compared with the preset temperature to acquire a comparison result.

At S203, based on the comparison result, the opening degree of an exhaust valve of an exhaust passage of the process chamber is adjusted to control the temperature of the reaction window.

Herein, the exhaust valve may be an electronic control valve, and different opening degrees correspond to different gas flow cross-sectional areas, that is, different opening degrees correspond to different exhaust amounts. The greater the exhaust amount is, the greater the rate of gas exchange between the gas in the process chamber and the external environment, and the faster the temperature reduction.

In some embodiments, the preset temperature may include a first preset temperature. Correspondingly, operation S202 may include: the present temperature is compared with the first preset temperature to acquire a comparison result. Correspondingly, operation S203 may include operation S203a: when the present temperature is greater than the first preset temperature, the opening degree of the exhaust valve is increased.

In some embodiments, operation S203 may include operation S203b: when the present temperature is less than the first preset temperature, the opening degree of the exhaust valve is reduced.

In some embodiments, the preset temperature may also include a second preset temperature greater than the first preset temperature. Correspondingly, operation S202 may also include: the present temperature is compared with the second preset temperature to acquire a comparison result. Correspondingly, operation S203a may include: when the present temperature is greater than the second preset temperature, the opening degree of the exhaust valve is increased to be fully opened. Herein, when the temperature is greater than the second preset temperature, the temperature of the reaction window needs to be reduced more quickly to maintain the temperature stability of the reaction window. Therefore, the gas flow cross-sectional area may be adjusted to the maximum, that is, the valve is fully opened, so as to reduce the generation of by-products and improve the yield of wafer production.

In some embodiments, the preset temperature may also include a third preset temperature less than the first preset temperature. Correspondingly, operation S202 may also include: the present temperature is compared with the third preset temperature to acquire a comparison result. Correspondingly, operation S203b may include: when the present temperature is less than the third preset temperature, the opening degree of the exhaust valve is reduced to be fully closed.

Herein, the first preset temperature, the second preset temperature and the third preset temperature may be set when the machine leaves the factory or set by the later engineers themselves. When the machine performs different process processes, different first preset temperature, second preset temperature and third preset temperature may be set. For example, in the case of a plasma etching process, the first preset temperature may be 120° C., the second preset temperature may be 125° C., and the third preset temperature may be 115° C. For example, in the case of a plasma enhanced chemical vapor deposition process, the first preset temperature may be 300° C., the second preset temperature may be 310° C., and the third preset temperature may be 290° C.

According to the method for temperature control provided in the embodiment, the present temperature of the reaction window in the process chamber of the semiconductor machine is compared with the first preset temperature, the second preset temperature and the third preset temperature respectively, the opening degree of the exhaust valve is adjusted according to the comparison results, it may quickly restore to the preset temperature by increasing or reducing the exhaust amount when the present temperature of the reaction window deviates from the preset temperature, so as to effectively control the temperature of the reaction window, keep it stable, reduce the by-products caused by temperature changes, and reduce the probability of product defects.

Figure 3A:
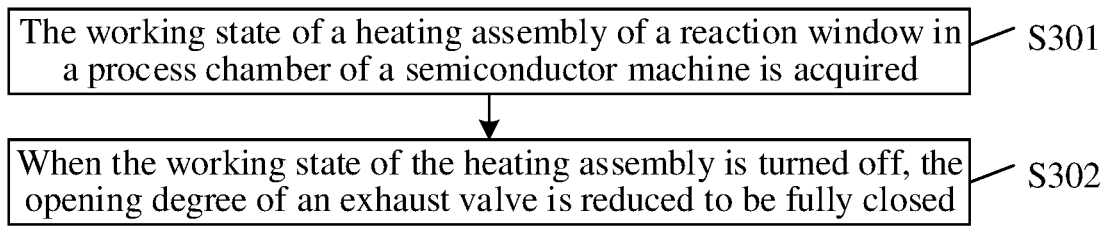
FIG. 3A is an implementation schematic flowchart of a method for temperature control provided in an embodiment of the disclosure.

The embodiment of the disclosure provides a method for temperature control, as illustrated in FIG. 3A, which may include the following operations.

At S301, the working state of a heating assembly of a reaction window in a process chamber of a semiconductor machine is acquired.

Herein, the working state of the heating assembly may include turned off or turned on.

At S302, when the working state of the heating assembly is turned off, the opening degree of an exhaust valve of an exhaust passage of the process chamber is reduced to be fully closed.

Herein, the working state of the heating assembly is turned off when an alarm occurs in the machine. In actual application, when the temperature of the reaction window is too high, for example, when it reaches the preset alarm temperature, or the vacuum degree in the reaction chamber is not within the preset vacuum degree range, the machine will give an alarm, thereby triggering the interlock, and the heating assembly will be turned off.

Figure 3B:
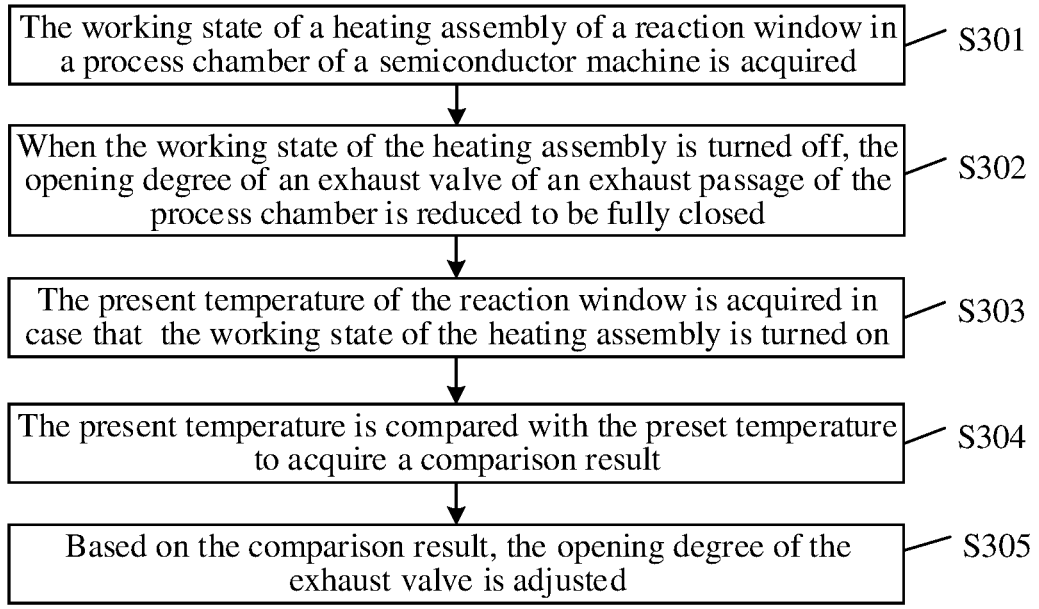
FIG. 3B is an implementation schematic flowchart of a method for temperature control provided in an embodiment of the disclosure.

In some embodiments, after an alarm occurs in the machine, the engineer will handle the alarm as soon as possible. After the abnormal state of the machine is handled, the heating assembly will be turned on, and the working state of the heating assembly is turned on. The method for temperature control may also include the operations illustrated in FIG. 3B. The method may also include the following operations.

At S303, the present temperature of the reaction window is acquired when the working state of the heating assembly is turned on.

At S304, the present temperature is compared with the preset temperature to acquire a comparison result.

At S305, based on the comparison result, the opening degree of the exhaust valve is adjusted.

In a method for the temperature control provided in the embodiment, when the heating assembly is turned off, the exhaust valve is controlled to be fully closed, which may realize a slowly cooling in the reaction chamber and provide sufficient time for the engineer to deal with the alarm. When the engineer finishes dealing with the alarm, the heating assembly is turned on, which reduces the phenomenon of the product defects more serious due to the rapid cooling.

In some embodiments, the operation that the exhaust amount of the exhaust passage of the process chamber is adjusted based on the comparison result to control the temperature of the reaction window may include that: the exhaust amount of the exhaust passage of the process chamber and the output power of the heating assembly are adjusted based on the comparison result to control the temperature of the reaction window. In actual application, when the present temperature is greater than the first preset temperature, the exhaust amount may be increased and the output power of the heating assembly may be reduced. For example, the output power is adjusted to 40% to 50% of the rated power, which may better control the temperature of the reaction window, control the temperature quickly and save the cost.

When the temperature of the reaction window deviates from the preset temperature, on the one hand, the exhaust valve may be controlled to control the gas flow; on the other hand, the working power of the heating assembly may be controlled and adjusted to maintain the temperature of the reaction window at the preset temperature, so as to avoid the attachment of accessories on the surface of the reaction window and the falling of formed particles to pollute the wafer, and in addition, maintaining the temperature of the reaction window may ensure the stability of chemical reaction in the plasma and maintain the uniformity of the critical size.

In actual application, in the case of batch production of wafers, when the first wafer in the first batch enters the reaction chamber, plasma etching of wafers will produce relatively high energy, resulting in abnormal temperature in the reaction window. Therefore, in some embodiments, when the first wafer in the first batch enters the reaction chamber, the exhaust amount of the exhaust passage of the process chamber is increased, and the heat dissipation is increased. At the same time, the output power of the heating assembly is reduced, then, the exhaust amount of the exhaust passage is slowly reduced, and the two are mutually complementary. In this way, the problem that the quality of the first wafer in the first batch is different from that of other wafers may be avoided.

Figure 4A:
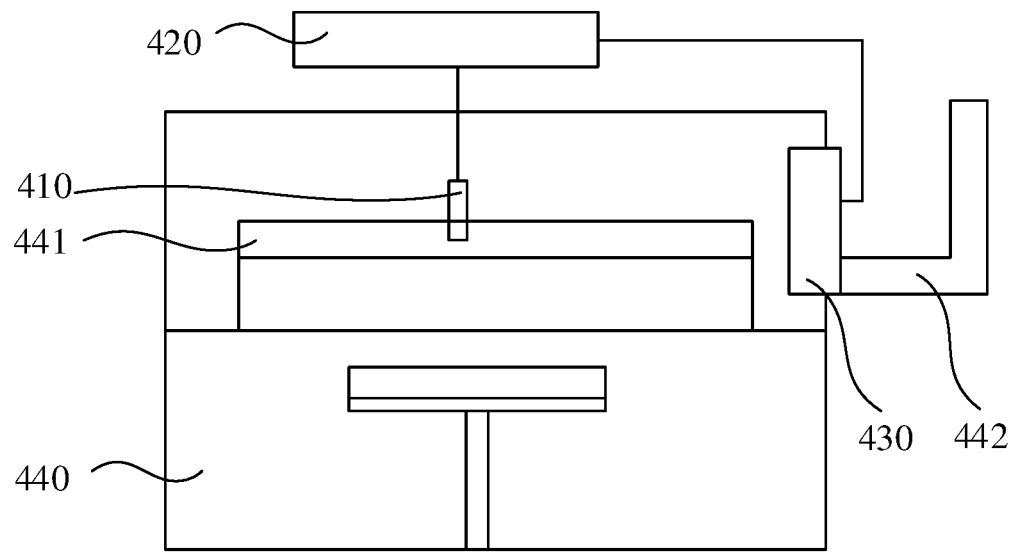
FIG. 4A is a schematic structure composition diagram of a system for temperature control provided in an embodiment of the disclosure.

The embodiment of the disclosure provides a system for temperature control, which is applied to a semiconductor machine. As illustrated in FIG. 4A, the system may include a temperature sensing assembly 410, a control assembly 420 and an exhaust adjusting assembly 430.

The temperature sensing assembly 410 is arranged on a reaction window 441 of a process chamber 440 of the semiconductor machine, and configured to sense the temperature of the reaction window 441.

Herein, the temperature sensing assembly may be any suitable temperature inductor or temperature sensor, such as a thermal resistance sensor and a thermocouple sensor. There may be two temperature sensing assemblies, one for sensing the temperature within the normal difference range and the other for sensing the temperature within the abnormal range. The temperature within the abnormal range refers to the temperature that causes an alarm occurring in the machine.

The control assembly 420 is connected with the temperature sensing assembly 410, and configured to: acquire the present temperature of the reaction window 441 from the temperature sensing assembly 410; compare the present temperature with the preset temperature to acquire a comparison result; and based on the comparison result, control the exhaust adjusting assembly 430 to adjust the exhaust amount of an exhaust passage 442 of the process chamber 440 to control the temperature of the reaction window 441.

The exhaust adjusting assembly 430 is arranged on the exhaust passage 442 of the process chamber 440, connected with the control assembly 420, and configured to control the exhaust amount of the exhaust passage 442.

Herein, the exhaust adjusting assembly may be directly arranged on the side wall of the process chamber or on the top of the process chamber. In this way, no exhaust pipe may be arranged between the exhaust adjusting assembly and the process chamber to save materials.

In some embodiments, the exhaust adjusting assembly may include a driving motor and an exhaust valve of the exhaust passage. The driving motor is configured to drive the exhaust valve to control the opening degree of the exhaust valve.

Herein, the exhaust valve may be an electric adjusting valve. By installing an electric valve positioner and adopting closed-loop adjustment, the valve may be dynamically stabilized in one position.

The embodiment of the disclosure provides a system for temperature control, which is applied to a semiconductor machine. As illustrated in FIG. 4A, the system may include a temperature sensing assembly 410, a control assembly 420 and an exhaust adjusting assembly 430.

The temperature sensing assembly 410 is arranged on a reaction window 441 of a process chamber 440 of the semiconductor machine, and configured to sense the temperature of the reaction window 441.

The control assembly 420 is connected with the temperature sensing assembly 410, and configured to: acquire the present temperature of the reaction window 441 from the temperature sensing assembly 410; compare the present temperature with the preset temperature to acquire a comparison result; and based on the comparison result, control the exhaust adjusting assembly 430 to adjust the exhaust amount of an exhaust passage 442 of the process chamber 440 to control the temperature of the reaction window 441.

The exhaust adjusting assembly 430 is arranged on the exhaust passage 442 of the process chamber 440, connected with the control assembly 420, and configured to control the exhaust amount of the exhaust passage 442.

Figure 4B:
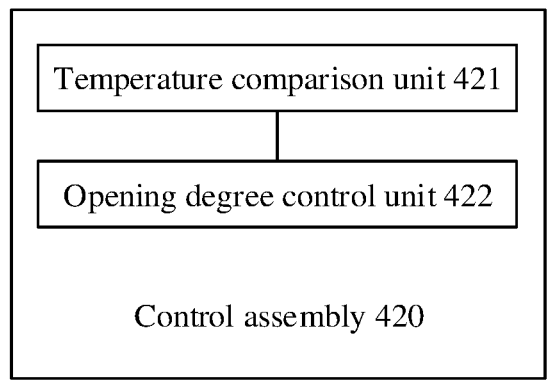
FIG. 4B is a schematic structure composition diagram of a control assembly provided in an embodiment of the disclosure.

FIG. 4B is a schematic structure composition diagram of a control assembly provided in an embodiment of the disclosure. As illustrated in FIG. 4B, the control assembly 420 may include a temperature comparison unit 421 and an opening degree control unit 422.

The temperature comparison unit 421 is configured to: acquire the present temperature of the reaction window from the temperature sensing assembly; compare the present temperature with the preset temperature to acquire a comparison result; and send an opening degree control signal to the opening degree control unit based on the comparison result.

The opening degree control unit 422 is configured to: receive the opening degree control signal; and control the driving motor to drive the exhaust valve based on the opening degree control signal to control the opening degree of the exhaust valve.

Herein, the temperature comparison unit may be realized by a specific logic circuit controller, such as a Logic Temperature Controller (LTC), may also be realized in the form of a software functional unit, and may also be realized in the form of a hardware logic circuit and the software functional unit. The opening degree control unit may be realized by the hardware logic circuit, such as Virtual I/O Processor (VIOP), may also be realized in the form of the software functional unit, or may also be realized by the hardware logic circuit and the software functional unit.

Figure 5A:
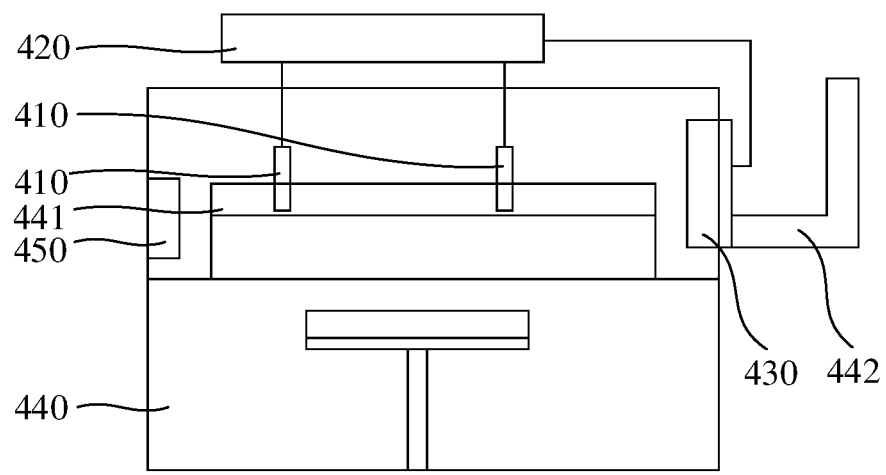
FIG. 5A is a schematic structure composition diagram of a system for temperature control provided in an embodiment of the disclosure.

The embodiment of the disclosure provides a system for temperature control, which is applied to a semiconductor machine. As illustrated in FIG. 5A, the system may include a temperature sensing assembly 410, a control assembly 420, an exhaust adjusting assembly 430 and a heating assembly 450.

The temperature sensing assembly 410 is arranged on a reaction window 441 of a process chamber 440 of the semiconductor machine, and configured to sense the temperature of the reaction window 441.

The control assembly 420 is connected with the temperature sensing assembly 410, and configured to: acquire the present temperature of the reaction window 441 from the temperature sensing assembly 410; compare the present temperature with the preset temperature to acquire a comparison result; and based on the comparison result, control the exhaust adjusting assembly 430 to adjust the exhaust amount of an exhaust passage 442 of the process chamber 440 to control the temperature of the reaction window 441.

The exhaust adjusting assembly 430 is arranged on the exhaust passage 442 of the process chamber 440, connected with the control assembly 420, and configured to control the exhaust amount of the exhaust passage 442.

The heating assembly 450 is arranged in the process chamber 440, and configured to heat the reaction window, herein, the power of the heating assembly may be adjustable.

Correspondingly, the control assembly 420 may also be configured to: acquire the working state of the heating assembly 450; and acquire the present temperature of the reaction window 441 in the process chamber 440 of the semiconductor machine when the working state of the heating assembly 450 is turned on.

Figure 5B:
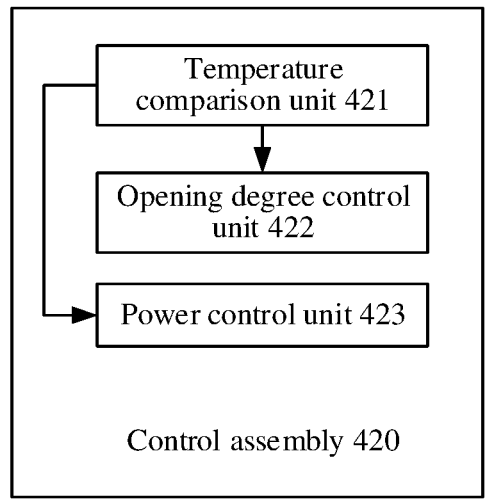
FIG. 5B is a schematic structure composition diagram of a control assembly provided in an embodiment of the disclosure.

In some embodiments, as illustrated in FIG. 5B, the control assembly may also include a power control unit 423, the power control unit is configured to receive a power control signal, and adjust the output power of the heating assembly based on the power control signal.

Correspondingly, the temperature comparison unit 421 is also configured to send a power control signal to the power control unit 423 based on the comparison result.

In some embodiments, the process chamber is isolated by a ceramic disk into an upper chamber and a lower chamber, and the lower chamber may be a vacuum environment for wafer processing, such as etching or coating.

In some embodiments, the system may also include a support assembly for supporting and fixing a wafer. Herein, the support assembly may include a chuck and a support column, and the chuck is configured to adsorb and fix the wafer. In some embodiments, the chuck may be an Electro Static Chuck (ESC), and the ESC may be provided with an electrode layer. When direct voltage is applied to the electrode layer, different charges will appear on the electrode layer and the wafer, so as to generate Coulomb attraction between the electrode layer and the wafer and adsorb the wafer on the surface of the ESC.

Based on the foregoing embodiments, the embodiment of the disclosure provides a device for temperature control.

Each unit included in the device and each module included in each unit may be realized by a processor in the temperature control system, and may also be realized through a specific logic circuit. In the process of implementation, the processor may be a Central Processing Unit (CPU), a Microprocessor Unit (MPU), a Digital Signal Processing (DSP) or a Field Programmable Gate Array (FPGA), etc.

Figure 6:
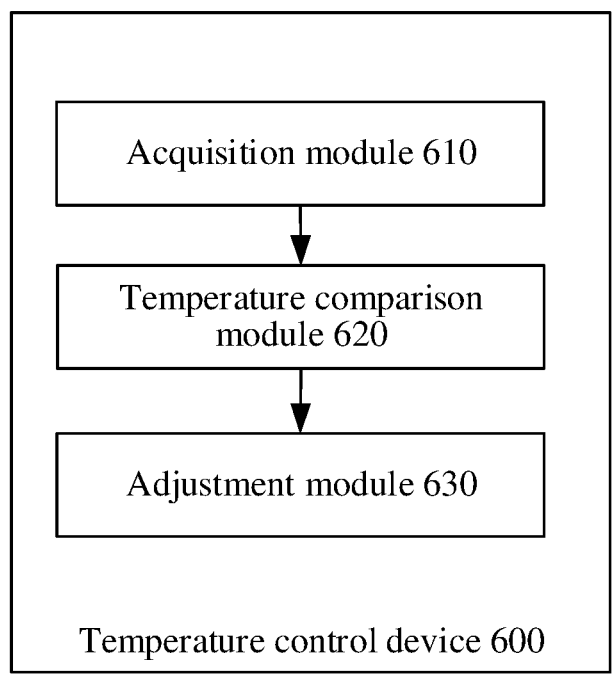
FIG. 6 is a schematic structure composition diagram of a device for temperature control provided in an embodiment of the disclosure.

FIG. 6 is a schematic structure composition diagram of a device for temperature control provided in an embodiment of the disclosure. As illustrated in FIG. 6, the device 600 for temperature control may include an acquisition module 610, a temperature comparison module 620 and an adjustment module 630.

The acquisition module 610 is configured to acquire the present temperature of a reaction window in a process chamber of a semiconductor machine.

The temperature comparison module 620 is configured to compare the present temperature with the preset temperature to acquire a comparison result.

The adjustment module 630 is configured to adjust the exhaust amount of an exhaust passage of the process chamber based on the comparison result to control the temperature of the reaction window.

In some embodiments, the temperature comparison module is also configured to compare the present temperature with the first preset temperature to acquire a comparison result. The adjustment module is also configured to reduce the opening degree of the exhaust valve when the present temperature is less than the first preset temperature.

In some embodiments, the adjustment module is also configured to increase the opening degree of the exhaust valve when the present temperature is greater than the first preset temperature.

In some embodiments, the temperature comparison module is also configured to compare the present temperature with the second preset temperature to acquire a comparison result, and the second preset temperature is greater than the first preset temperature. The adjustment module is also configured to increase the opening degree of the exhaust valve to be fully opened when the present temperature is greater than the second preset temperature.

In some embodiments, the temperature comparison module is also configured to compare the present temperature with the third preset temperature to acquire a comparison result, and the third preset temperature is less than the first preset temperature. The adjustment module is also configured to reduce the opening degree of the exhaust valve to be fully closed when the present temperature is less than the third preset temperature.

In some embodiments, the acquisition module is also configured to: acquire the working state of the heating assembly of the reaction window in the semiconductor machine; and acquire the present temperature of the reaction window in the process chamber of the semiconductor machine when the working state of the heating assembly is turned on.

In some embodiments, the adjustment module may include an exhaust amount adjustment module. The exhaust amount adjustment module is configured to adjust the exhaust amount of the exhaust passage of the process chamber according to the working state of the heating assembly to control the temperature of the reaction window. Herein, when the working state of the heating assembly is turned off, the exhaust amount adjustment module reduces the opening degree of the exhaust valve to be fully closed, which may prevent the rapid reduction of the temperature in the reaction chamber and damage to the wafer when the heating assembly is off.

In some embodiments, the adjustment module may include an exhaust amount adjustment module and a power adjustment module. The exhaust amount adjustment module is configured to adjust the exhaust amount of the exhaust passage of the process chamber according to the working state of the heating assembly to control the temperature of the reaction window. The power adjustment module is configured to adjust the output power of the heating assembly according to the comparison result to control the temperature of the reaction window.

In actual application, the output power of the heating assembly may be adjusted only through the power adjustment module, the exhaust amount of the exhaust passage of the process chamber may be adjusted only through the exhaust amount adjustment module, or the output power of the heating assembly and the exhaust amount of the exhaust passage of the process chamber may be adjusted simultaneously through the power adjustment module and the exhaust amount adjustment module, so as to improve the temperature control efficiency For example, when the present temperature of the reaction window in the process chamber of the semiconductor machine is greater than the preset temperature, the power of the heating assembly may be reduced through the power adjustment module, and at the same time, the opening degree of the exhaust valve may be increased through the exhaust amount adjustment module. When the present temperature of the reaction window in the process chamber of the semiconductor machine is less than the preset temperature, the power of the heating assembly may be increased through the power adjustment module, and at the same time, the opening degree of the exhaust valve may be reduced through the exhaust amount adjustment module. The two complement each other to control the temperature of the reaction window together and stabilize the temperature of the reaction window at the preset temperature, so as to improve the temperature control efficiency.

The above descriptions about the apparatus embodiments are similar to descriptions about the method embodiments and beneficial effects similar to those of the method embodiments are achieved. Technical details undisclosed in the apparatus embodiments of the disclosure may be understood with reference to the descriptions about the method embodiments of the disclosure.

It is to be noted that, in the embodiments of the disclosure, when the above temperature control method is implemented in form of a software function module and sold or used as an independent product, it may also be stored in a computer readable storage medium. Based on such an understanding, the technical solutions of the embodiments of the disclosure substantially or parts making contributions to the related art may be embodied in form of a software product. The computer software product is stored in a storage medium, including multiple instructions configured to enable the temperature control system to execute all or part of the method in each embodiment of the disclosure. The storage medium includes various media capable of storing program codes such as a U disk, a mobile hard disk, a Read Only Memory (ROM), a magnetic disk or an optical disk. As a consequence, the embodiments of the disclosure are not limited to any specific hardware and software combination.

Correspondingly, the embodiment of the disclosure provides a computer readable storage medium having therein a computer program that when executed by a processor, implements the steps in the embodiment of the above method.

It is to be pointed out here that the above descriptions about the storage medium embodiments are similar to the descriptions about the method embodiment and beneficial effects similar to those of the method embodiment are achieved. Technical details undisclosed in the storage medium embodiments of the disclosure are understood with reference to the descriptions about the method embodiment of the disclosure.

It is to be understood that "one embodiment" or "an embodiment" mentioned in the whole specification means that specific features, structures or characteristics related to the embodiment are included in at least one embodiment of the disclosure. Therefore, "in one embodiment" or "in an embodiment" appearing everywhere in the whole specification does not always refer to the same embodiment. In addition, these specific features, structures or characteristics may be combined in one or more embodiments in any proper manner. It is to be understood that, in each embodiment of the disclosure, a magnitude of a sequence number of each process does not mean an execution sequence and the execution sequence of each process should be determined by its function and an internal logic and should not form any limit to an implementation process of the embodiments of the disclosure. The sequence numbers of the embodiments of the disclosure are adopted not to represent superiority-inferiority of the embodiments but only for description.

It is to be noted that, in this context, the terms "include", "containing" or any other variation thereof are intended to cover non exclusive inclusion, so that a process, method, article or device that includes a series of elements includes not only those elements, but also other elements not explicitly listed, or elements inherent in such process, method, article or device. Without further restrictions, the element defined by the statement "including a . . . " does not exclude the existence of another same element in the process, method, article or device including the element.

In some embodiments provided by the disclosure, it is to be understood that the disclosed system and method may be implemented in another manner. The system embodiments described above are only schematic. For example, the division of the unit is only a logical function division, and there may be another division mode in actual implementation, for example, a plurality of units or components may be combined or integrated into another system, or some features may be ignored or not executed. In addition, coupling or direct coupling or communication connection between each displayed or discussed component may be indirect coupling or communication connection, implemented through some interfaces, of the device or the units, and may be electrical and mechanical or adopt other forms.

The units described as separate parts may or may not be physically separated, and parts displayed as units may or may not be physical units, and namely may be located in the same place, or may also be distributed to multiple network units. Part or all of the units may be selected according to a practical requirement to achieve the purposes of the solutions of the embodiments.

In addition, each functional unit in each embodiment of the disclosure may be integrated into a processing unit, each unit may also serve as an independent unit and two or more than two units may also be integrated into a unit. The integrated unit may be implemented in a hardware form and may also be implemented in form of hardware and software functional unit.

Those of ordinary skill in the art should know that all or part of the steps of the method embodiment may be implemented by related hardware instructed through a program, the program may be stored in a computer readable storage medium, and the program is executed to execute the steps of the method embodiment. The storage medium includes: various media capable of storing program codes such as a mobile storage device, a ROM, a magnetic disk or a compact disc.

Or, when the integrated unit of the disclosure is implemented in form of a software function module and sold or used as an independent product, it may also be stored in a computer readable storage medium. Based on such an understanding, the technical solutions of the embodiments of the disclosure substantially or parts making contributions to the related art may be embodied in form of a software product. The computer software product is stored in a storage medium, including a plurality of instructions configured to enable a system for temperature control to execute all or part of the method in each embodiment of the disclosure. The storage medium includes: various media capable of storing program codes such as a mobile hard disk, a ROM, a magnetic disk or a compact disc.

The above is only the implementation of the disclosure and not intended to limit the scope of protection of the disclosure. Modifications or replacements are apparent to those skilled in the art within the technical scope disclosed by the disclosure, and these modifications or replacements shall fall within the scope of protection of the disclosure.

INDUSTRIAL APPLICABILITY

The embodiment of the disclosure provides a system, method and device for temperature control, and a storage medium. The temperature control method includes: acquiring the present temperature of a reaction window in a process chamber of a semiconductor machine; comparing the present temperature with the preset temperature to acquire a comparison result; and based on the comparison result, adjusting the exhaust amount of an exhaust passage of the process chamber to control the temperature of the reaction window. Therefore, according to the embodiment of the disclosure, the exhaust amount of the exhaust passage of the process chamber may be adjusted based on the temperature change of the reaction window in the process chamber so as to control the temperature of the reaction window, and thus, the temperature of the reaction window may be effectively stabilized and the stability and the uniformity of the process are easily improved.

What is claimed is:

1. A method for temperature control, comprising:
    acquiring a working state of a heating assembly of the reaction window in the semiconductor machine;
    reducing the opening degree of the exhaust valve to be fully closed in case that the working state of the heating assembly is turned off;
    acquiring a present temperature of the reaction window in the process chamber of the semiconductor machine in case that the working state of the heating assembly is turned on;
    comparing the present temperature with a preset temperature to acquire a comparison result; and
    adjusting an exhaust amount of an exhaust passage of the process chamber and an output power of the heating assembly based on the comparison result, to control the temperature of the reaction window; and
    wherein the exhaust passage of the process chamber is provided with an exhaust valve; and
    wherein adjusting the exhaust amount of the exhaust passage of the process chamber based on the comparison result comprises:
    adjusting an opening degree of the exhaust valve based on the comparison result.

2. The method according to claim 1, wherein the preset temperature comprises a first preset temperature; and
    wherein comparing the present temperature with the preset temperature to acquire the comparison result comprises: comparing the present temperature with the first preset temperature to acquire a comparison result; and
    wherein adjusting the opening degree of the exhaust valve based on the comparison result comprises: increasing the opening degree of the exhaust valve in case that the present temperature is greater than the first preset temperature.

3. The method according to claim 2, wherein the preset temperature further comprises a second preset temperature, the second preset temperature is greater than the first preset temperature;
    wherein comparing the present temperature with the preset temperature to acquire the comparison result further comprises: comparing the present temperature with the second preset temperature to acquire a comparison result; and
    wherein increasing the opening degree of the exhaust valve in case that the present temperature is greater than the first preset temperature comprises: increasing the opening degree of the exhaust valve to be fully opened in case that the present temperature is greater than the second preset temperature.

4. The method according to claim 3, wherein the first preset temperature is 120° C., and the second preset temperature is 125° C.

5. The method according to claim 2, wherein adjusting the opening degree of the exhaust valve based on the comparison result comprises:
    reducing the opening degree of the exhaust valve in case that the present temperature is less than the first preset temperature.

6. The method according to claim 5, wherein the preset temperature further comprises a third preset temperature, the third preset temperature is less than the first preset temperature;
    wherein comparing the present temperature with the preset temperature to acquire the comparison result further comprises: comparing the present temperature with the third preset temperature to acquire a comparison result; and
    wherein reducing the opening degree of the exhaust valve in case that the present temperature is less than the first preset temperature comprises: reducing the opening degree of the exhaust valve to be fully closed in case that the present temperature is less than the third preset temperature.

7. The method according to claim 6, wherein the third preset temperature is 115° C.

8. A device for temperature control, applied to a semiconductor machine, comprising:
    an acquisition circuit, configured to acquire a present temperature of a reaction window in a process chamber of the semiconductor machine;
    a temperature comparison circuit, configured to compare the present temperature with a preset temperature to acquire a comparison result; and an adjustment circuit, configured to adjust an exhaust amount of an exhaust passage of the process chamber based on the comparison result, to control a temperature of the reaction window;

wherein the acquisition circuit is configured to acquire the present temperature of the reaction window in the process chamber of the semiconductor machine based on:

acquiring a working state of a heating assembly of the reaction window in the semiconductor machine;

reducing the opening degree of the exhaust valve to be fully closed in case that the working state of the heating assembly is turned off; and acquiring a present temperature of the reaction window in the process chamber of the semiconductor machine in case that the working state of the heating assembly is turned on; and wherein the adjustment circuit is configured to adjust the exhaust amount of the exhaust passage of the process chamber based on the comparison result, to control the temperature of the reaction window by adjusting the exhaust amount of the exhaust passage of the process chamber and an output power of the heating assembly based on the comparison result, to control the temperature of the reaction window;

wherein the exhaust passage of the process chamber is provided with an exhaust valve; and wherein the adjustment circuit is further configured to:
adjust an opening degree of the exhaust valve based on the comparison result.

9. The device according to claim 8, wherein the preset temperature comprises a first preset temperature; and wherein the temperature comparison circuit is further configured to: compare the present temperature with the first preset temperature to acquire a comparison result; and the adjustment circuit is further configured to: increase the opening degree of the exhaust valve in case that the present temperature is greater than the first preset temperature.

10. The device according to claim 9, wherein the preset temperature further comprises a second preset temperature, the second preset temperature is greater than the first preset temperature;

wherein the temperature comparison circuit is further configured to: compare the present temperature with the second preset temperature to acquire a comparison result; and the adjustment circuit is further configured to: increase the opening degree of the exhaust valve to be fully opened in case that the present temperature is greater than the second preset temperature.

11. A system for temperature control, applied to a semiconductor machine, comprising:

a temperature sensing assembly, a control assembly, an exhaust adjusting assembly, and a heating assembly, wherein the temperature sensing assembly is arranged on a reaction window of a process chamber of the semiconductor machine, and configured to sense a temperature of the reaction window;

the control assembly is connected with the temperature sensing assembly, and configured to: acquire a present temperature of the reaction window from the temperature sensing assembly; compare the present temperature with a preset temperature to acquire a comparison result; and control the exhaust adjusting assembly to adjust an exhaust amount of an exhaust passage of the process chamber based on the comparison result, to control the temperature of the reaction window; and the exhaust adjusting assembly is arranged on the exhaust passage of the process chamber, connected with the control assembly, and configured to control the exhaust amount of the exhaust passage;

the heating assembly is arranged in the process chamber, and configured to heat the reaction window, wherein the control assembly is further configured to: acquire a working state of the heating assembly; reducing the opening degree of the exhaust valve to be fully closed in case that the working state of the heating assembly is turned off, and acquire a present temperature of the reaction window in the process chamber of the semiconductor machine in case that the working state of the heating assembly is turned on; and wherein the exhaust adjusting assembly comprises a driving motor and an exhaust valve of the exhaust passage, wherein the driving motor is configured to drive the exhaust valve to control an opening degree of the exhaust valve.

12. The system according to claim 11, wherein the control assembly comprises a temperature comparison circuit and an opening degree control circuit, wherein the temperature comparison circuit is configured to: acquire the present temperature of the reaction window from the temperature sensing assembly; compare the present temperature with the preset temperature to acquire the comparison result; and send an opening degree control signal to the opening degree control circuit based on the comparison result; and the opening degree control circuit is configured to: receive the opening degree control signal; and control the driving motor to drive the exhaust valve based on the opening degree control signal to control the opening degree of the exhaust valve.

13. The system according to claim 12, wherein the control assembly further comprises:

a power control circuit, configured to receive a power control signal, and adjust an output power of the heating assembly based on the power control signal; and the temperature comparison circuit is further configured to send the power control signal to the power control circuit based on the comparison result.

* * * * *